(12) United States Patent
Bazylenko (10) Patent No.: US 6,549,688 B2
(45) Date of Patent: Apr. 15, 2003

(54) MONOLITHICALLY-INTEGRATED OPTICAL DEVICE AND METHOD OF FORMING SAME

(75) Inventor: Michael Bazylenko, Eveleigh NSW (AU)

(73) Assignee: Redfern Integrated Optics Pty LTD, Eveleigh (AU)

( * ) Notice: Subject to any disclaimer, the term of this patent is extended or adjusted under 35 U.S.C. 154(b) by 0 days.

(21) Appl. No.: 09/900,612

(22) Filed: Jul. 6, 2001

(65) Prior Publication Data
US 2003/0007718 A1 Jan. 9, 2003

(51) Int. Cl.$^7$ .................................................. G02B 6/12
(52) U.S. Cl. .............................. 385/14; 372/6; 359/341
(58) Field of Search ........................... 385/14–19, 147; 375/6; 359/341; 252/301.4

(56) References Cited

U.S. PATENT DOCUMENTS

| 5,200,029 | A | 4/1993 | Bruce et al. |
| 5,563,979 | A | 10/1996 | Bruce et al. |
| 5,847,865 | A | 12/1998 | Gopinath et al. |
| 6,226,308 | B1 * | 5/2001 | Samson et al. ............... 372/40 |
| 6,292,292 | B1 * | 9/2001 | Garoto et al. ............... 359/341 |

FOREIGN PATENT DOCUMENTS

| JP | 7281039 | 10/1995 |
| WO | WO 9708790 | 3/1997 |

* cited by examiner

Primary Examiner—Akm E. Ullah
(74) Attorney, Agent, or Firm—Ladas & Parry (57) ABSTRACT

The present invention provides an integrated optical device comprising a metaloxide-based optical planar waveguide amplifier monolithically integrated on a common substrate with at least one additional planar waveguide selected from a group comprising: a planar waveguide signal-processing circuit arranged to process an optical communications signal; and a planar waveguide pump-signal coupling circuit arranged to couple or decouple a pump wavelength to or from the amplifier; wherein the amplifier has a metal-oxide-based core comprising an optically-transmissive metal oxide material doped with a gain medium and is arranged to amplify an optical communication signal when optically pumped with a source of pump radiation. The amplifier can have a core composed of aluminium oxide doped with erbium and/or ytterbium. The signal processing circuit may comprise a multiplexer, demultiplexer, channel gain equalizer, N×M optical switch matrix, an optical modulator, or an add-drop multiplexer. The pump-signal coupling circuit may comprise an asymmetric Mach-Zehnder interferometer.

40 Claims, 9 Drawing Sheets

MONOLITHICALLY-INTEGRATED OPTICAL DEVICE AND METHOD OF FORMING SAME

TECHNICAL FIELD

The present invention relates to a monolithically-integrated optical device and in particular, to an integrated optical planar waveguide amplifier. The invention also relates to a method of fabricating such an optical device.

BACKGROUND OF THE INVENTION

Optical amplifiers are an important component in optical networks for distributing optical signals. In recent years, erbium-doped optical fibres have been developed which have the capability of amplifying an optical signal. In order to amplify an optical communications signal propagating in an erbium-doped fibre amplifier, light of a different wavelength is coupled into the fibre from a pumping laser. The pumping laser stimulates electronic transitions which amplify the communications signal as it passes through the erbium-doped optical fibre.

In applications where optical components need to be relatively small and device integration is desirable, it is advantageous to provide an optical amplifier in the form of a planar waveguide integrated on a single substrate. However, there are difficulties in integrating erbium-doped amplifiers. In particular, since the longitudinal dimensions of integrated amplifiers tend to be much smaller than the longitudinal dimensions of erbium-doped fibre amplifiers, it is necessary to increase the gain of the amplifier. Attempts have been made to increase the gain by increasing the percentage of erbium. However, the gain in erbium-doped fibre amplifiers has been found to decrease when the erbium doping concentration exceeds a critical level. For example, in silica-based amplifiers, maximum gain is achieved with an erbium concentration of around 0.01–0.02 atomic %. It is believed that at higher concentrations of erbium, the gain is reduced due to an increase in erbium-erbium interactions. One method of addressing this problem has been to increase the solubility of erbium in silica-based glass by incorporating various glass modifiers into the structure, such as sodium and calcium. However, this approach has had limited success, particularly when the core layer of the waveguide is deposited by sputter deposition.

Sputter deposition involves bombarding a target of source material in a manner which ejects electrons and target atoms from the target and deposits at least some of the ejected target atoms onto a substrate. In configurations where a magnet is positioned beneath the target so as to increase plasma densities closer to the target, the technique is referred to as magnetron sputtering. One of the characteristics of sputter film deposition is that different species of target atoms tend to have different deposition rates due to differences in gas scatter rates and substrate sticking coefficients. Thus, a film deposited from a composite target containing a number of different atomic species, (e.g. silica, erbium, sodium and calcium) can have a composition which is different to that of the composite target. There is therefore a need for an integrated optical planar waveguide amplifier which has an improved gain, and for an improved method of fabricating a planar optical device in which an amplifier is integrated with other optical devices.

SUMMARY OF THE INVENTION

In accordance with a first aspect of the present invention there is provided an integrated optical device comprising a metaloxide-based optical planar waveguide amplifier monolithically integrated on a common substrate with at least one additional planar waveguide selected from a group comprising:

(i) a planar waveguide signal-processing circuit arranged to process an optical communications signal; and (ii) a planar waveguide pump-signal coupling circuit arranged to couple or decouple a pump wavelength to or from the amplifier;

wherein the amplifier has a metal-oxide-based core comprising an optically-transmissive metal oxide material doped with a gain medium and is arranged to amplify an optical communication signal when optically pumped with a source of pump radiation.

Preferably, the metal oxide comprises at least 50 mol % of the core of the amplifier, and more preferably at least 70 mol % of the core. The composition of the core of the amplifier may predominantly comprise aluminium oxide. In one embodiment, the metal oxide comprises at least 80 mol % of the core. The amplifier may be formed directly on the substrate. Alternatively, one or more additional layers, such as another planar waveguide, may be interposed between the amplifier and the substrate.

Preferably, the amplifier is integrated with and coupled to at least the planar waveguide signal-processing circuit. The planar waveguide communications-signal-processing circuit may comprise one or a combination of planar waveguide devices selected from a group comprising:

a communications-signal multiplexer, arranged to multiplex a plurality of communications wavelengths;

a communications-signal demultiplexer, arranged to demultiplex a plurality of optical communications wavelengths;

a channel gain equaliser;

an N×M optical switch matrix;

an optical modulator;

an optical attenuator;

a variable optical attenuator;

an add-drop multiplexer; and a reconfigurable add-drop multiplexer.

The communications-signal multiplexer and the communications-signal demultiplexer may comprise an arrayed-waveguide grating. Any number of other optical components may be monolithically integrated on the common substrate with above-described planar waveguides. The pump-signal coupling circuit may comprise one or more planar waveguides selected from a group comprising:

a pump-signal multiplexer arranged to multiplex an optical communications wavelength and an optical pump wavelength; and a pump-signal demultiplexer arranged to demultiplex an optical communications wavelength and an optical pump wavelength.

The pump-signal multiplexer and the pump-signal demultiplexer may each comprise an asymmetric Mach-Zehnder inferometer.

The pump-signal coupling circuit may incorporate a slab waveguide for collecting pump radiation from a plurality of sources and guiding the radiation towards the amplifier. In one embodiment, the pump-signal coupling circuit is arranged to be pumped by a laser diode bar array. The integrated optical device may firer comprise a laser diode bar array integrated on the common substrate and optically coupled to the planar waveguide amplifier. Pump radiation may be coupled into the amplifier using a cladding mode of the amplifier. In an alternative embodiment, the planar waveguide coupling circuit is arranged to be optically connected to an external pumping source not integrated in the optical device The amplifier may be arranged to provide sufficient gain (communications sight amplification) to compensate for insertion losses of the integrated optical device. For example, the amplifier can be arranged to compensate for any optical losses in the signal-processing circuit and pump-signal coupling circuit or in optical connections between those circuits. In one embodiment, the signal-processing circuit comprises a communications-signal demultiplexer and the amplifier is arranged to compensate for any optical losses arising from the demultiplexer.

The amplifier may comprise one or more amplifiers, and may be arranged to amplify communications signals in one or more respective input channels of the communications-signal processing circuit. Alternatively, the amplifier may comprise one or more amplifiers arranged to amplify communications signals in one or more respective output channels of the signal-processing circuit.

The amplifier may be arranged on the substrate adjacent and substantially parallel to a side of the signal-processing circuit so as to conserve space on the substrate. The amplifier may include at least one mirror structure for reflecting and guiding optical signals. The mirror structure can be used to guide a signal around a sharp corner rather than a curved bend, and can thus enable the amplifier to be laid out over a smaller area than is possible if smooth bends are used. In one embodiment, the mirror structure operates by means of total internal reflection at an air interface. The air interface may comprise an air interface of a trench etched into the surface of the device. In another embodiment, the mirror structure comprises a metallised surface, such as a metallised wall of a trench. In a further embodiment, We mirror structure comprises a Bragg grating.

The amplifier may include an optical coupling region for optically coupling a terminal end of the amplifier to another planar waveguide. Where the amplifier is to be coupled to a waveguide of different effective refractive index, the coupling region may be formed such that there is a gradual transition of effective refractive index from the terminal end of the amplifier to the other waveguide, so as to minimise coupling losses. Preferably, the transition of effective refractive index is adiabatic. In the coupling region, a core of the amplifier may be tapered in cross-sectional dimensions and/or refractive index so as to create a substantially adiabatic transition of effective refractive index from the amplifier to the other waveguide. In one embodiment, the amplifier projects into a second core to which the amplifier is to be coupled. The second core may comprise a core of the signal-processing circuit or the pump-signal coupling circuit.

The signal-processing circuit and the pump-signal coupling circuit may comprise silica-based waveguides. The gain medium may comprise lanthianide atoms such as erbium or ytterbium. In one embodiment, the gain medium comprises both erbium and ytterbium. The inventors have found that the solubility of erbium in aluminium oxide is greater than in silica-based materials. Thus, where the amplifier core comprises erbium-doped aluminium oxide, the present invention has the advantage of enabling higher core concentrations of erbium to be attained than is possible with silica-based cores. For example, the concentration of erbium in the core may be in the range from about 0.1 atomic % to about 1.0 atomic %. By comparison, known silica-based amplifying cores are doped with a maximum of about 0.01 to 0.02 atomic % of erbium.

The core may optionally include a gain-broadening dopant for broadening a gain spectrum of the amplifier. For example, the gain-broadening dopant may comprise, but is not limited to, fluorine, tellurium, sodium or calcium. Also, the core may optionally comprise at least one refractive-index-modifying dopant, such as fluorine. Further, the core may optionally comprise a dopant capable of reducing interactions between atoms of the gain medium which decrease the potential gain of the amplifier. For example, where the gain medium comprises erbium, the core may be doped with fluorine to reduce erbium interactions and to decrease the refractive index of the core. An advantage of using fluorine is that it tends to scavenge hydroxyl species from aluminium oxide. Hydroxyl species are believed to absorb energy from erbium ions.

Preferably, the metal-oxide-based core is encapsulated between an optical buffer layer below the core, and an optical cladding layer above the core, both of which have a lower refractive index than the core. The cladding layer and/or buffer layer may be silica-based. The cladding layer and/or buffer layer may comprise a silica-based core of another waveguide.

The amplifier core may comprise a sputter-deposited material. Preferably, the core comprises a film of material in which any defects which could potentially cause absorption at a wavelength of the optical signal have been substantially eliminated as a result of using appropriate deposition conditions and/or post-deposition annealing. Preferably, the core comprises a film in which any defects and impurities which could potentially cause non-radiative energy transfer from excited erbium atoms have been substantially eliminated as a result of using appropriate deposition conditions and/or post-deposition annealing.

In accordance with a second aspect of the present invention, there is provided a method of fabricating an optical device comprising a plurality of planar waveguides monolithically integrated on a common substrate, the method comprising:

forming a planar waveguide amplifier on the substrate, the amplifier having a metaloxide-based core comprising a metal oxide doped with a gain medium and being arranged to amplify an optical communications signal when optically pumped with a source of pump radiation;

forming at least one additional integrated planar waveguide on the substrate, the additional waveguide being selected from a group comprising:
  (i) a planar waveguide communications-signal processing circuit arranged to process an optical communications signal; and
  (ii) a planar waveguide pump-signal coupling circuit arranged to couple a pump wavelength into the amplifier.

The step of forming the amplifier may comprise;

depositing a core layer; and using lithographically-defined etching to shape the core layer into the metal-oxide-based core with a channel geometry.

The step of forming the amplifier may further comprise forming an optical buffer layer on which the core is subsequently formed, and forming an optical cladding layer over the buffer layer and core. The buffer layer and/or cladding layer may comprise a core of a silica-based waveguide. For example, the core of the amplifier may be disposed within a core of a silica-based waveguide. The core of the amplifier may be annealed post deposition, and may be annealed again after being etched. The annealing may be carried out using annealing conditions selected to substantially eliminate defects which could potentially cause absorption at a wavelength of an optical signal to be amplified. The annealing conditions may also be selected to substantially eliminate defects and impurities which could potentially cause non-radiative energy transfers from excited atoms of the gain medium. Where each additional planar waveguide has a silica-based core, the metal-oxide-based core of the amplifier is preferably formed before each silica-based core is formed in order to minimise the fabrication temperature of the silica-based core.

Where the additional planar waveguide comprises the communications-signal processing circuit, the amplifier may be formed on the substrate adjacent and substantially parallel to the signal-processing circuit.

The buffer and cladding layers of the amplifier and each additional planar waveguide may be silica-based. The core of each additional planar waveguide may also be silica-based.

Preferably, the step of forming the amplifier further comprise forming a coupling region at a terminal and of the amplifier for coupling optical signals between the amplifier and another waveguide. The step of forming the coupling region may comprise forming the core of the amplifier such that there is a gradual transition of effective refractive index from the terminal end of the amplifier to the other waveguide. The core of the amplifier may project within a second core to which the amplifier is to be coupled. The gradual transition of effective refractive index may be achieved by forming the core such that the cross-sectional dimensions and/or refractive index of the core are adiabatically tapered. The second core may comprise a core of the signal-processing circuit or the pump-signal coupling circuit.

The gain medium in the amplifier core may comprise lanthanide atoms such as erbium and/or ytterbium. The amplifier core may be in the form of a channel waveguide.

The core of the amplifier may be formed from a metal-oxide-based core layer which may be deposited by sputtering. Preferably, the core layer is deposited by reactive DC sputtering, and most preferably, by reactive DC magnetron sputtering. Both forms of DC sputtering have the advantage of producing a higher deposition rate than is possible with RF sputtering. Where the expression "DC sputtering" is used herein. it is to be understood to include both magnetron DC sputtering and non-magnetron DC sputtering, unless otherwise specified. The sputtering may be carried out in an atmosphere which comprises oxygen and an additional reactive gas capable of modifying the refractive index of the core layer. The additional reactive gas may contain fluorine, and may comprise carbon tetrafluorine ($CF_4$). Where the reactive gas contains fluorine, the refractive index of the deposited core layer may be reduced through a formation of aluminium oxyfluorine. A sputtering target used to deposit the core layer may be fluorinated during the deposition to an extent sufficient to increase a sputtering rate of the target. Alternatively, or in addition, the core layer may be fluorinated directly as it grows. The fluorination may be carried out by cyclically flowing a fluorine-containing gas over the target or core layer and then halting the flow of the fluorine-containing gas in a manner which prevents total fluorination (i.e. conversion to $AlF_3$) of the entire core layer. Thus, the core layer may be in the form of a multilayered structure in which the concentration of fluorine changes from layer to layer, preferably periodically, resulting in an average refractive index which is lower than that of pure aluminium oxide.

The core layer may also be formed by simultaneously DC sputtering two targets of aluminium oxide, only one of which is fluorinated, and forming a core layer composed of material sputtered from both targets. Preferably, the substrate is exposed to only one of the two targets at a time, for example by cyclically moving the substrate from one target to the other using a substrate rotation stage. Alternatively, the core layer may be formed by simultaneously exposing the substrate to both targets. Preferably, the core layer is deposited by reactively DC sputtering at least one metallic target containing aluminium in a sputtering atmosphere containing oxygen. The atmosphere during the reactive DC sputtering may further comprise a noble gas such as argon The reactive DC sputtering is preferably carried out such that there is a level of ion bombardment at the target surface which is sufficient to prevent surface passivation (i.e. oxide formation) of the gain medium in each target. Where the sputtering atmosphere comprises oxygen mixed with a noble gas such as argon, the gas flows of oxygen and the noble gas are preferably arranged so as to reduce or prevent oxidation of the exposed target surface. In one embodiment, a noble-gas outlet is provided close to the target surface and an oxygen outlet is provided closer to the substrate surface, so as to minimise the concentration of oxygen at the target surface.

Any silica-based layer in the amplifier and additional waveguide(s) may be deposited by plasma-enhanced chemical vapour deposition (PECVD), preferably in the absence of nitrogen or nitrogen-containing gases. A silica-based layer which is deposited in this way has the advantage of exhibiting reduced optical absorption in the wavelength range from 1.50 μm to 1.55 μm due to the absence of a nitrogen-induced absorption peak in this region. A liquid source of precursor may be used in the plasma-enhanced chemical vapour deposition to form each silica-based layer. The liquid source of precursor may comprise tetra ethyl oxysilane.

For the purposes of this specification it is to be clearly understood that the word "comprising" means "including but not limited to", and that the word "comprises" has a corresponding meaning.

Embodiments of invention will now be described, by way of example only, with reference to accompanying drawings.

DETAILED DESCRIPTION OF THE DRAWINGS

Figure 1:
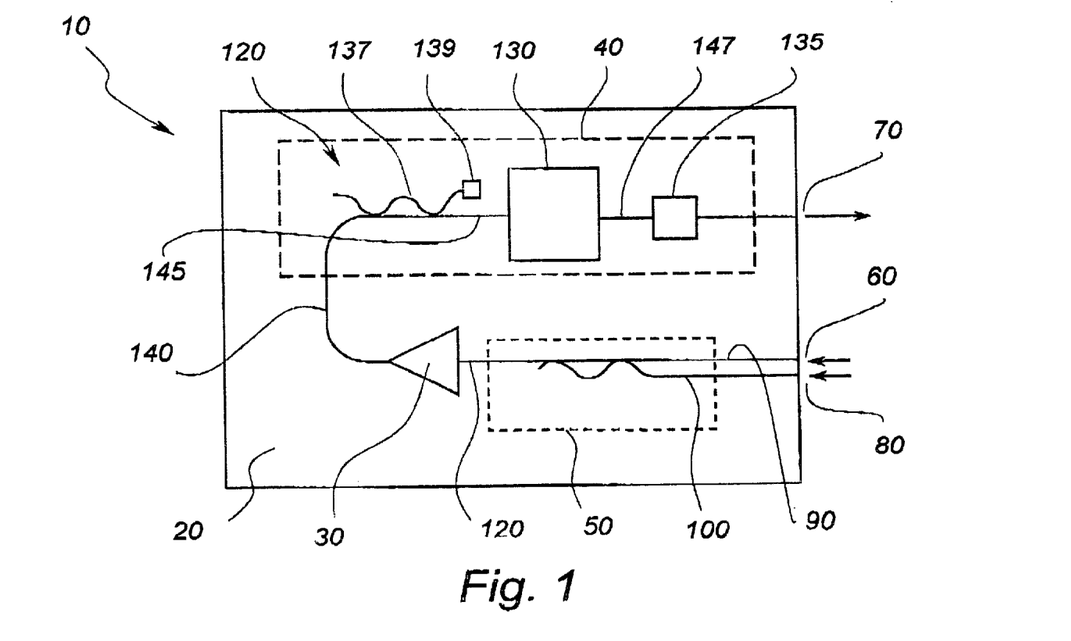
FIG. 1 schematically illustrates planar waveguide components in an embodiment in an integrated optical device.

Referring to the schematic illustration in FIG. 1, a first embodiment of an integrated optical device 10 in accordance with the present invention comprises a single substrate 20 on which is integrated: an optical amplifier 30; a communications-signal-processing circuit 40; and a pump-signal-coupling circuit 50 in the form of an asymmetric Mach-Zehnder interferometer. Each of the components 30, 40, 50 is in the form of planar optical waveguides formed on the same substrate 20. The amplifier 30 comprises a metal-oxide-based waveguide and the other components 40, 50 comprise silica-based waveguides. The device 10 has a first input port 60 for receiving communications signals to be processed, and an output port 70 for outputting communications signals processed by the device. The device 10 also includes a second input port 80 for receiving an optical pumping signal from a pumping laser (not shown). The first and second input ports 60, 80 arm inputs to respective first and second arms 90, 100 of the asymmetric Mach-Zehnder interferometer 50. The asymmetric Mach-Zehnder interferometer 50 outputs a coupled signal, comprising the communications signal multiplexed with the pump-signal, via an interconnecting waveguide 120 to the amplifier 30. The amplifier 30 (described in detail below) is designed to have a gain which substantially compensates for optical losses in other parts of the device 10. For example, where the combined losses of the signal processing circuit 40, coupling circuit 50 and interconnecting waveguides are a total of −6 dB, the amplifier 30 can be designed to have a gain of +6 dB. An optical communications signal processed by such a device would suffer no net losses. Thus, from the point of view optical processor. of communications signals, the device can be considered to be a "lossless" integrated The signal processing circuit 40 in this embodiment comprises a pump-signal demultiplexer 120, communications signal demultiplexer 130, and a gain equalizer 135. The pump-signal demultiplexer 120 is in the form of an asymmetric Mach-Zehnder interferometer 137 in which one output arm is connected to a pump-signal absorber 139. The pump-signal demultiplexer 120 extracts optical signals of the pump wavelength from an output channel 140 of the amplifier 30, leaving behind an amplified communications signal which is input into an input channel 145 of the demultiplexer 130. Pump signals extracted by the pump-signal demultiplexer are absorbed by the pump-signal absorber 139. The gain equaliser 135 is designed to ensure that each output channel 147 of the communications-signal demultiplexer 130 has the same level of gain. The gain equaliser 135 is not shown in detail, but can be a fixed or variable attenuator known in the art.

Figure 2:
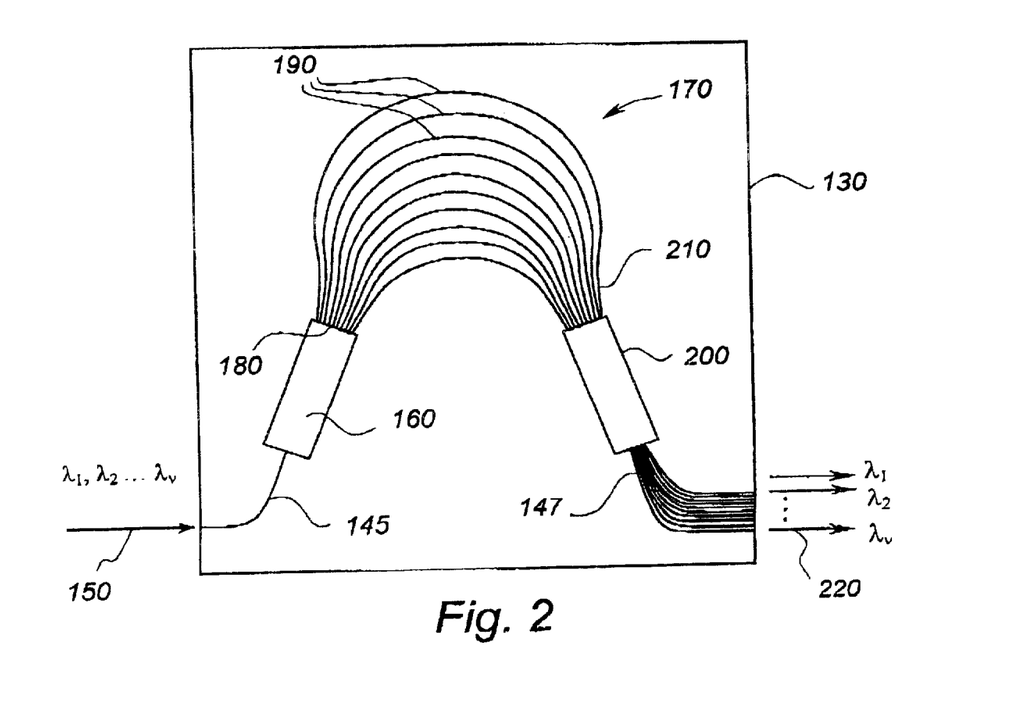
FIG. 2 is an embodiment of a planar waveguide communications signal demultiplexer which can be integrated in the device shown in FIG. 1.

Referring to FIG. 2, an embodiment of the communications-signal demultiplexer 130 is shown in detail. The demultiplexer includes at least one input waveguide 145 for receiving wavelength-multiplexed optical signals 150 having a plurality of wavelengths $\lambda_1$, $\lambda_2 \ldots \lambda_n$, a first slab waveguide 160 for dividing optical power received from the input waveguide 145, an arrayed-waveguide grating (AWG) 170 coupled to an output 180 of the first slab waveguide 160 and arranged to guide optical signals through a plurality of waveguides 190 such that optical signals in neighboring waveguides 190 have a constant phase difference. A second slab waveguide 200 is coupled to an output region 210 of the AWG 170 and is arranged to separate wavelengths of signals output from the AWG The second slab waveguide 200 outputs n demultiplexed optical signals 220 having different wavelengths $\lambda_1$, $\lambda_2 \ldots \lambda_n$, respectively, into n respective output waveguides 147, which in turn transmit the optical signals to n respective channels of the output port 70 via the gain equaliser 135. Thus, each output waveguide 147 outputs a different wavelength obtained from the multiplexed input signal.

Figure 3:
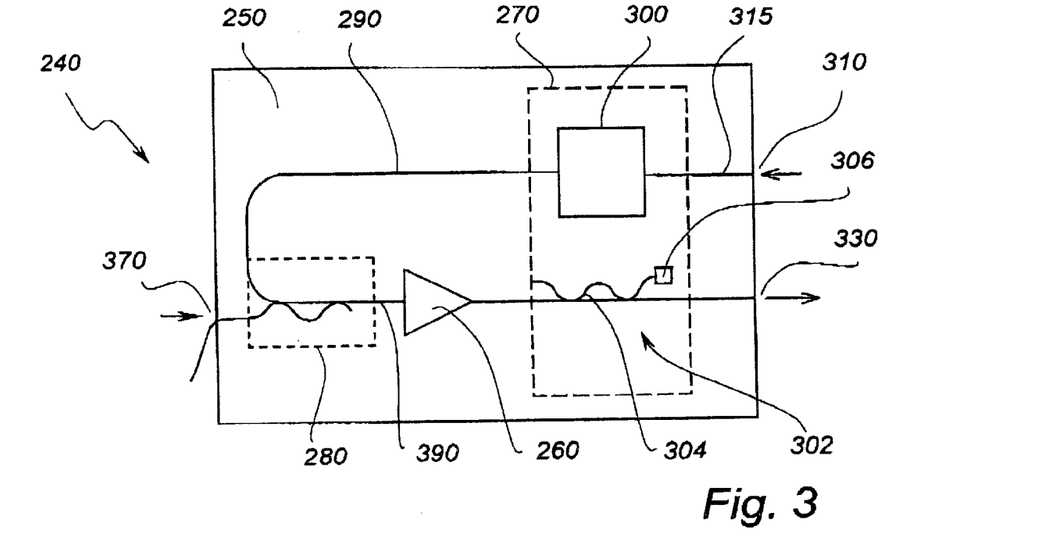
FIG. 3 schematically illustrates planar waveguide components in a second embodiment of an integrated optical device.

A second embodiment of an integrated optical device 240 will now be described with reference to FIGS. 3 and 4. As with the first embodiment, the device 240 comprises a substrate 250 on which is integrated. a planar waveguide optical amplifier 260; a planar waveguide communications-signal processing circuit 270; and a planar waveguide pump-signal coupling circuit 280. As with the previous embodiment, the amplifier 260 is metaloxide-based and the other components 270, 280 are silica-based. The signal-processing circuit 270 comprises an optical wavelength multiplexer 300 (shown in detail in FIG. 4) and a pump-signal demultiplexer 302 which includes an asymmetric Mach-Zehnder interferometer 304 and a pump-signal absorber 306 for absorbing an extracted pump-signal Unlike the previous embodiment, the amplifier 260 in FIG. 3 is arranged at the output 290 of the multiplexer 300, rather than at the input.

The integrated device 240 has in input port 310 comprising n input channels (shown as a single line 315 in FIG. 3) for receiving n respective optical communications signals having n respective wavelengths $\lambda_1, \lambda_2 \ldots \lambda_n$, and an output port 330 for outputting a multiplexed communications signal comprising n wavelengths, $\lambda_1, \lambda_2 \ldots \lambda_n$ via a single channel.

Figure 4:
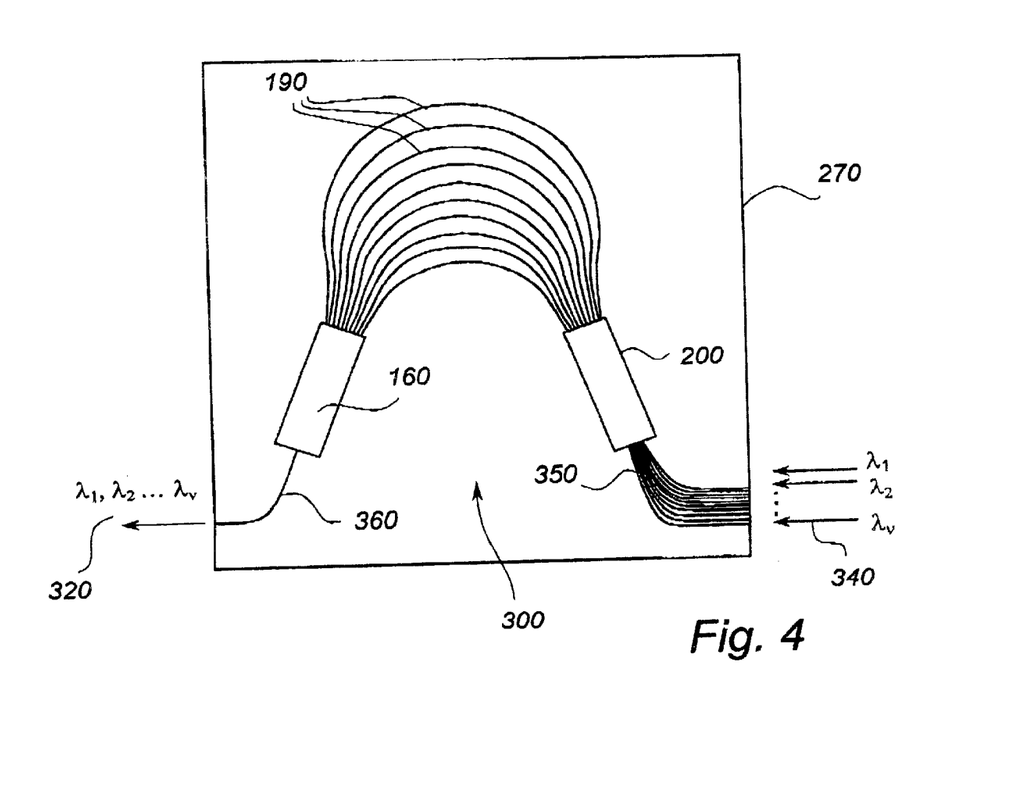
FIG. 4 is an embodiment of a planar waveguide communications signal multiplexer which be integrated in the device shown in FIG. 3.

Referring to FIG. 4 the waveguide layout of the communications signal multiplexer 300 is essentially the same as that of the demultiplexer 130 shown in FIG. 2, but is connected such that optical signals are propagated in an opposite direction to that shown in FIG. 2. In other words, the plurality of n output waveguides 147 shown in FIG. 2 function as input waveguides 350 in FIG. 4 for inputting n communications signals 340. Similarly, the input waveguide 145 shown in FIG. 2 functions as an output waveguide 360 in FIG. 4 for outputting a multiplexed signal 320. As with the previous embodiment, the device 240 shown in FIG. 3 also includes a second input port 370 for inputting an optical pumping signal from a pumping laser (not shown) into the pump-signal coupling circuit 280. The coupling circuit 280 couples the pump wavelength (received through second input port 370) to a communications signal which is output from the multiplexer 300, and outputs the coupled signal to the amplifier 260 via an interconnecting waveguide 390. The amplifier 260 is in turn connected to the output port 330 via the pump-signal demultiplexer 302 which removes the pump wavelength, As with the previous embodiment, the amplifier 260 is designed to have a gain which compensates for any optical losses in other parts of the device. However, it will be understood that in both of the above embodiments the amplifier can alternatively designed to provide a gain which is either more or less than the optical losses of the device.

For example, if the losses of the device are −4 dB, the amplifier can be arranged amplify with a gain of, say, +6 dB in order to provide a net gain of +2 dB for the device, depending on the requirements of the application.

A person skilled in the art will understand that the signal-processing circuits 40, 270 shown in FIGS. 1 and 3 can alternatively comprise another type of optical planar waveguide or a combination of any number of planar optical waveguides. Other examples of signal-processing circuits which could be used in the first and second embodiments include, but are not limited to, one or more of the following:

a gain equaliser;

an N×M optical switch matrix;

an optical modulator;

an optical attenuator;

a variable optical attenuator;

an add drop multiplexer; and a reconfigurable add/drop multiplexer.

Where there are a plurality of communication signals to be amplified, the integrated device may also include a plurality of amplifiers and coupling circuits. For example, the communications-signal processing circuit may have a plurality of output channels which are each amplified by separate amplifiers. Alternatively, a plurality of signal-processing circuits can be integrated on a common substrate and one or more output channels of each signal-processing circuit can be connected to one or more respective amplifiers integrated on the substrate.

It will be understood that a configuration may be used in which the pump-signal propagates through the amplifier in an opposite direction to the communications signal, referred to as "reverse pumping".

Figure 5:
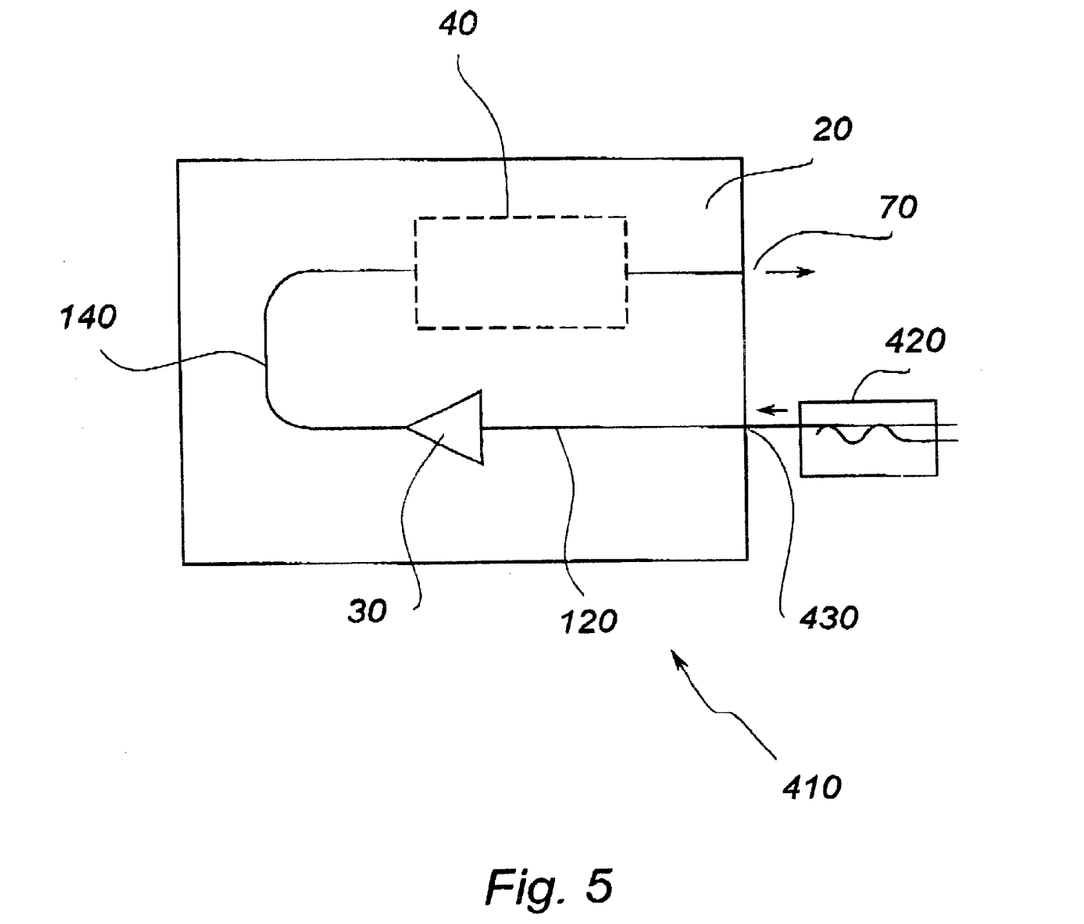
FIG. 5 schematically illustrates planar waveguide components in a third embodiment of an integrated optical device.

With reference to FIG. 5, a third embodiment of an integrated device 410 is shown. Corresponding features in FIGS. 1 and 5 have been given corresponding reference numerals. This embodiment differs from the embodiment shown in FIG. 1 in that there is no monolithically-integrated pump-signal coupling circuit. Instead, a communications signal is multiplexed with a pump wavelength using an external coupling circuit 420 which is not integrated on the substrate 20 and need not be planar. The amplifier 30 is therefore connected directly to an input port 430 for receiving signals output by the external coupling circuit 420.

Fabrication of Integrated Metal-oxide-based Amplifier

FIGS. 1 and 3 each schematically illustrate an integrated planar waveguide amplifier 30, 260. An embodiment of such an amplifier will now be described in detail with reference to FIG. 6. In this embodiment, a planar waveguide core 440 of the amplifier is formed directly on a silica buffer layer 450, which is in turn formed on a silicon substrate 460. A second core 445 which comprises part of another waveguide is formed directly over the amplifier core 440 such that the amplifier core is projects within the second core 445. The amplifier core 440 is metal-oxide-based and has a higher refractive index than the second core 445. The second core 445 is covered with an optically-isolating cladding layer 470 which has a lower refractive index than both the amplifier core 440 and second core 445. The second core 445, amplifier core 440, buffer layer 450 and cladding layer 470 are each formed from optically-transmissive materials. In this embodiment, the buffer layer 450 and cladding layer 470 both comprise silica ($SiO_2$) and the second core 445 comprises germanium-doped silica. The amplifier core 440 is aluminium-oxide-based, but includes a number of other constituents in smaller quantities to modify the physical properties of the aluminium oxide. In order for the aluminium oxide core 440 to amplify an optical communications signal, it must be doped with a gain medium such as erbium and/or ytterbium atoms. In this embodiment, the core 440 is doped with erbium atoms at a concentration of 0.5 atomic %, but the core can be co-doped with ytterbium. It should be noted that other doping levels can be used. The concentration of erbium can be in the range from 0.3 atomic % to 1.0 atomic %, and the concentration of ytterbium should be roughly 5–10 times the erbium concentration i.e. in the range from 1.5 atomic % to 30 atomic %. In general, the concentration of erbium and/or ytterbium should be selected to maximise the gain of the amplifier. Other constituents which can be added to the aluminium oxide core 440 are discussed in more detail below.

Figure 6:
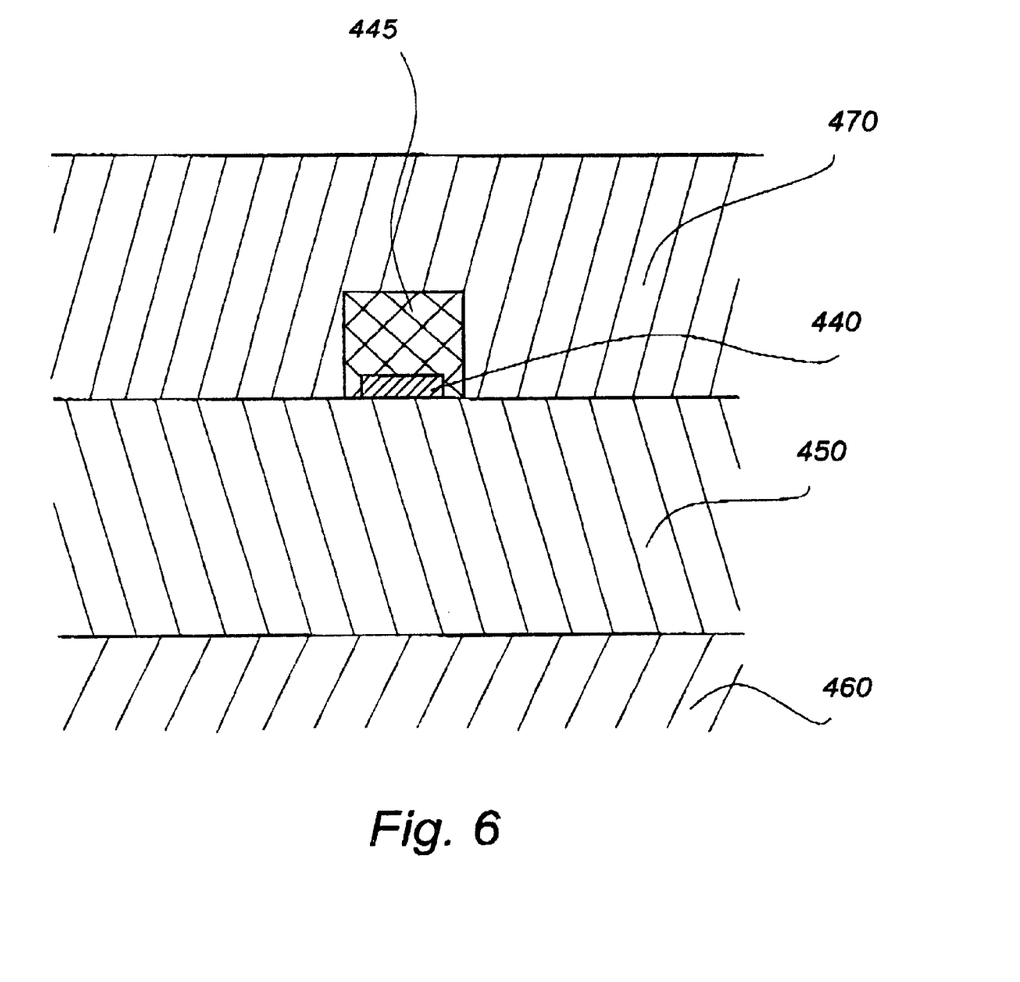
FIG. 6 is a cross-sectional view of an embodiment of a planar waveguide amplifier.

The amplifier core 440 can have any one of a range of different cross-sectional dimensions, depending on whether the application requires the core to support a single mode or multiple modes. Many applications require the core to support a single mode at the wavelength of the optical signal to be amplified, typically 1.55 $\mu$m. In order to guide the fundamental mode alone, the core dimensions will depend on the wavelength of the signal and the refractive index of the core material. For example, for a wavelength of 1.55 $\mu$m and a core refractive index of 1.6, the core width (measured in the plane of the substrate 460) should be no greater than 2 $\mu$m and the height (measured perpendicular to the substrate) should be no greater than 0.8 $\mu$m. The thicknesses of the buffer layer 450 and the cladding layer 470 are less critical, and can be anywhere in the range from at least 2 $\mu$m to 20 $\mu$m.

A method of fabricating the metal-oxide-based amplifier shown in FIG. 6 will now be described with reference to FIGS. 7 to 10.

Figure 7:
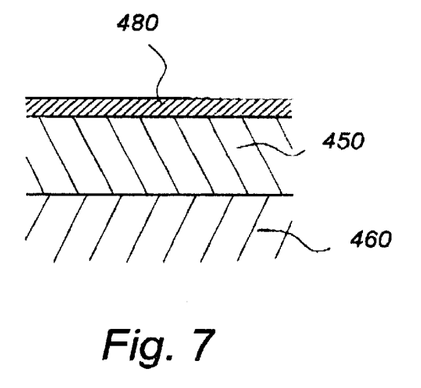
FIGS. 7–10 show the amplifier of FIG. 6 at four stages of fabrication.

Referring to FIG. 7, the first stage of fabrication involves depositing a thin film 480 of aluminium-oxide-based material on a silica buffer layer 450. The buffer layer is formed by thermal oxidation of the silicon substrate 460. The composition of the eventual amplifier core will have the same composition as the thin film 480. The aluminium-oxide-based film is deposited by reactive DC magnetron sputtering and the composition of the film 480 is controlled by using an appropriate target composition, sputtering gas and deposition conditions as disclosed in co-pending U.S. patent application Ser. No. 09/900438 entitled "Planar waveguide amplifier" filed in the name of Michael Bazylenko et al. (assigned to Redfern Integrated Optics Pty. Ltd.) on the same day as the present application, the disclosure of which is hereby specifically incorporated by cross-reference.

Figure 8:
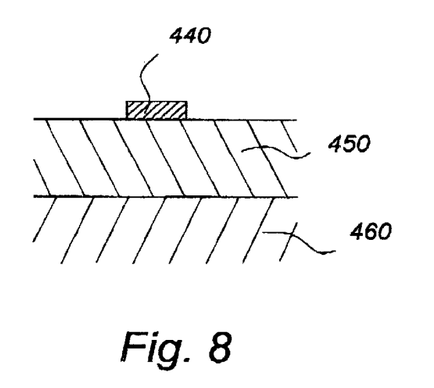

Referring to FIG. 8, the aluminium-oxide-based film 480 is then shaped into a channel waveguide structure 440 by means of photolithographically-defined chemical or dry etching (reactive ion etching, ion beam milling, or reactive ion beam etching).

Figure 9:
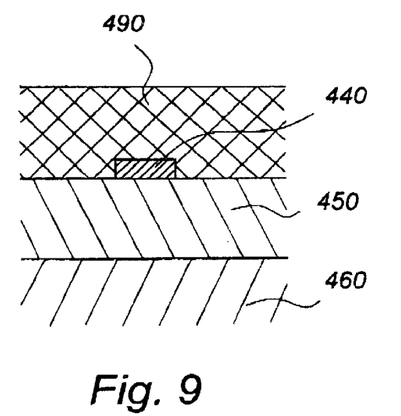

Turning to FIG. 9, a germanium-doped silica layer 490 is then deposited over the aluminum-oxide-based core 440. The silica-based layer 490 and optionally the buffer layer 450 can be fabricated in accordance with the method described in Australian provisional application number PRI 1782 entitled "Silica-based optical device fabrication" filed in the name of Redfern Integrated Optics Pty. Ltd. on Nov. 29, 2000, the disclosure of which is hereby incorporated by reference.

Figure 10:
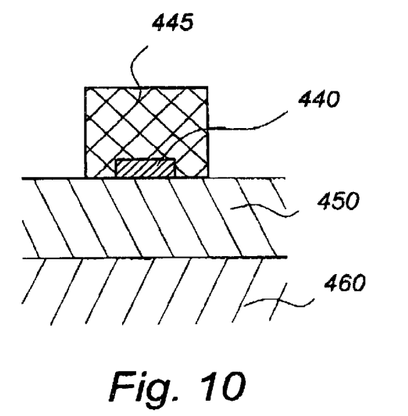

Referring to FIG. 10, a second stage of photolithography and etching is then used to define a channel waveguide 445 from the silica-based layer 490. Finally, once the silica-based core 445 has the desired shape, it is encapsulated in silica by depositing the silica cladding layer 470 (by PECVD) over the core 445 and buffer layer 450 to form the structure shown in FIG. 6.

The aluminium oxide core 440 can be annealed, ideally prior to the deposition of the silica-based layer 490. In this embodiment the annealing temperature is 700°, but it will be understood that the aluminium oxide core can also be annealed at a temperature in the range from 700° C. to 850° C. The annealing temperature for the aluminium oxide should not exceed about 850° C. as recrystallisation of the aluminium oxide takes place at temperatures above this temperature. Although the annealing can be carried out in an oxygen-free atmosphere, such nitrogen or argon, the aluminium oxide is best annealed in an atmosphere which contains oxygen, such as air or pure oxygen, in order to ensure that the aluminium oxide does not become oxygen-deficient during the annealing. The annealing time is not critical, but is typically at least one hour.

It is also possible to anneal the completed amplifier structure shown in FIG. 6 in order to remove defects, alleviate stresses and to compensate for any oxygen deficiencies in all layers. However, as annealing can also promote interfacial mixing of the layers, it is preferable that an annealing step is carried out directly the core 445 is formed It has been found that annealing tends to reduce the refractive index of silica films deposited by PECVD. In order to compensate for this reduction in refractive index, silica films can be doped with a refractive index-increasing dopant, such as germanium oxide. For example, when the buffer layer is deposited by PECVD, it can be simultaneously doped with germanium oxide during the PECVD process to an extent sufficient to compensate for any future annealing-induced decrease in refractive index.

Various core-modifying chemical elements can be added to the amplifier core layer 480 during or after the deposition in order to increase the solubility of erbium, and thus to prevent clustering of erbium atoms at high concentrations. Certain modifiers have been found to increase erbium solubility while avoiding concentration-quenching effects, which would otherwise reduce the $Er^{3+}$ radiative lifetime at relatively high concentrations (i.e. at erbium-to-silicon atomic ratios greater than about 0.02). Modifiers that are useful in this regard are alkaline metals such as sodium and alkaline earth metals such as calcium.

Modifiers are also usefully incorporated into the core to control the homogenous and inhomogeneous broadening of the $Er^{3+}$ absorption and emission peaks. Such modifiers include alkali and alkaline earth metals, which in at least some cases, tend to make the peaks narrower, and elements such as lanthanum, yttrium and zirconium, which contribute high field strength ions and tend to broaden the peaks. It is believe that fluorine can also assist in the suppression of erbium-erbium interactions. A further modifier, tellurium, can also be added to the core layer to broaden the gain spectrum. All of the above modifiers can be incorporated into the core layer 490 during the sputter deposition process.

Fabrication of Integrated Silica-based Circuits

Figure 11:
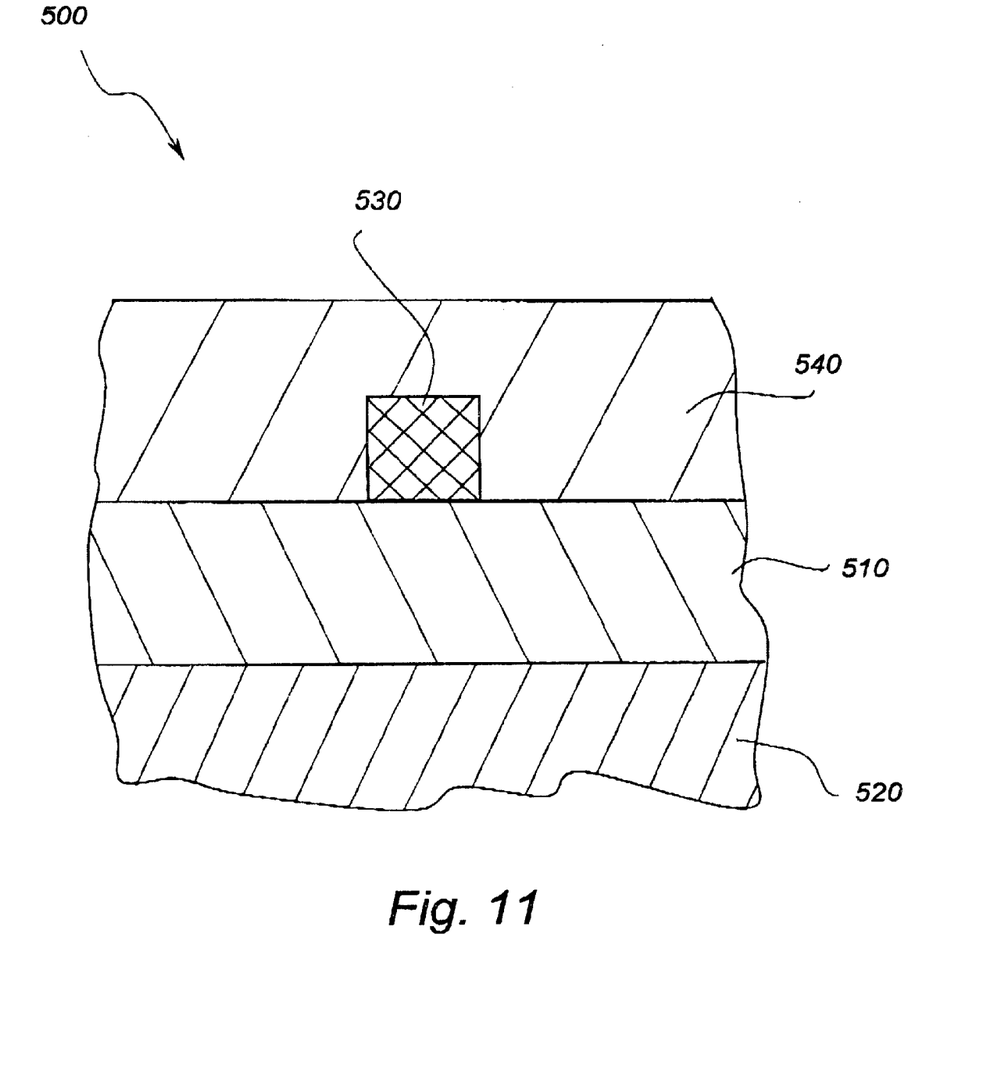
FIG. 11 is a cross-sectional view of an embodiment of a silica-based planar waveguide.

The planar waveguide signal-processing circuit and planar waveguide coupling circuit shown in FIGS. 1 to 5 are all silica-based waveguides which have a cross-section generally of the form shown in FIG. 11. Each silica waveguide 500 comprises a buffer layer 510 formed on a substrate 520, a core 530 formed on the buffer layer 510, and a cladding layer 540 formed over the core 530 and buffer layer 510 The buffer layer 510 and cladding layer 540 are both formed from silica, and the core 530 comprises silica doped with refractive-index-increasing dopants such as germanium or phosphorus. The core 530 is formed by using PECVD to deposit a doped silica film (for example, a germanium-doped silica film) and forming the film into the appropriate shape using photolitahographically-defined etching before the cladding layer 540 is deposited. The buffer cladding layers 510, 540 can be deposited by PECVD.

EXAMPLE

Fabrication of Integrated Device

In this example, a planar optical amplifier monolithically integrated with a silica-based planar waveguide demultiplexer (based on an arrayed-waveguide grating) and a silica-based pump-signal coupling circuit was fabricated on a silicon substrate. First, a buffer Layer comprising a 12-$\mu$m-thick layer of thermally-grown silicon dioxide was formed over the surface of a silicon substrate. A 0.7-micron-thick layer of aluminium oxide doped with 0.5 atomic % erbium and 5 atomic % ytterbium was then deposited over the buffer layer using DC magnetron sputtering. Using photolithography and etching, the aluminum-based layer was then shaped to form a channel waveguide with a width of 1.8 micrometers, and annealed at a temperature of 700° C. in an atmosphere of air for a period of 2 hours. A 6-$\mu$m-thick film of silica containing about 10 mot % germanium dioxide was then deposited over the aluminium-oxide-based core using PECVD with the following liquid precursors: tetraethoxysilane (TEOS); and teta-methyl germanium (TMG). All silica-based cores required for the silica-based waveguides of the demultiplexer coupling circuit and amplifier were then formed using photolithography and etching to shape the germanium-doped silica layer. A 20-$\mu$m-thick cladding layer was then deposited over the exposed areas of the buffer layer and over the cores of the amplifier, demultiplexer and coupling circuit. The cladding layer coated the sides of all cores in silicon dioxide, leaving terminal ends exposed to form the input and output ports of the integrated device.

Waveguide Layout

Figure 12:
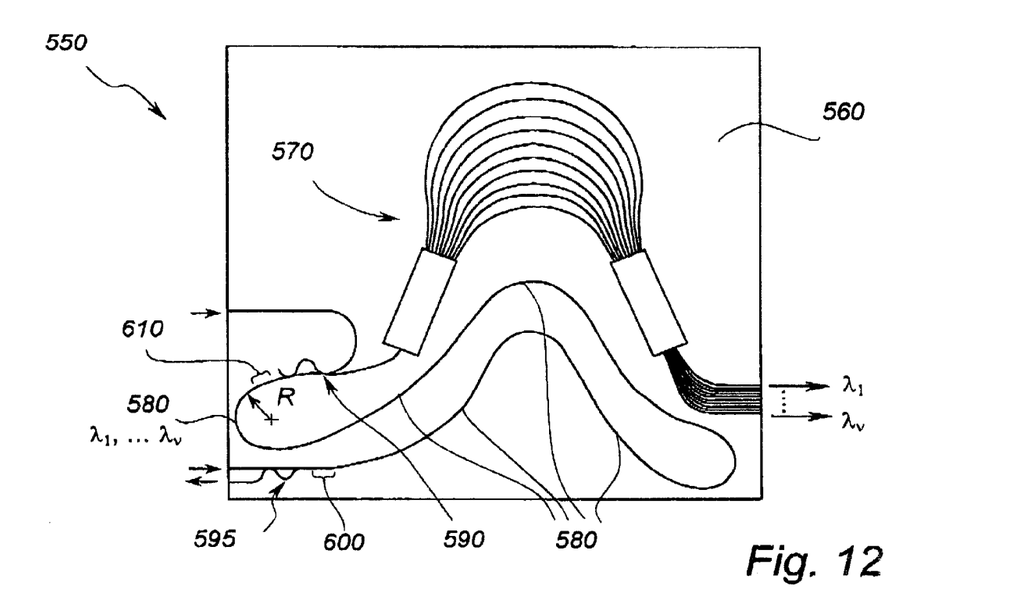
FIG. 12 is a plan view illustrating waveguide layout in an embodiment of an integrated optical device comprising a demultiplexer, an amplifier, and a pump-signal coupling circuit.
Figure 14:
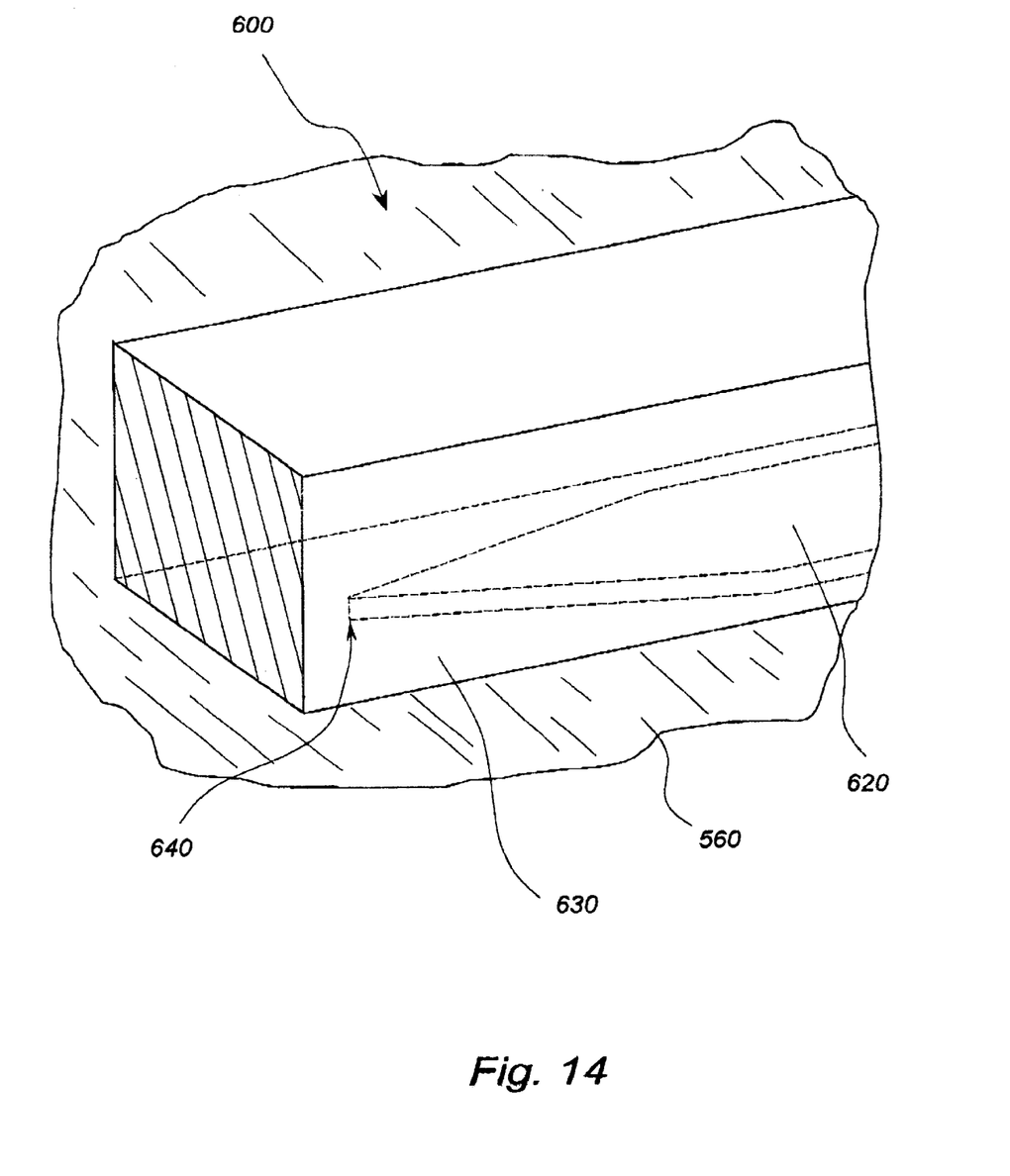
FIG. 14 is a pictorial view of a mode converter in which a tapered metal-oxide-based core of an amplifier is formed directly on top of a silica-based core of another waveguide.

FIG. 12 shows an embodiment of an integrated optical device 550 comprising a silicon substrate 560 on which is formed a silica-based communications-signal demultiplexer 570, an aluminium-oxide-based amplifier 580, a silica-based pump-signal coupling circuit 590, and a silica-based pump-signal demultiplexer 595. The communications-signal demultiplexer 570 is based on an arrayed-waveguide grating and is Ace 15 the same as the embodiment 130 shown in FIG. 2, while the pump-signal coupling circuit 590 and pump-signal demultiplexer 595 comprise asynumetric Mach-Zehnder interferometers as in the embodiments shown in FIGS. 1 and 3. In this embodiment, a reverse-pumping configuration is used in which the pump-signal propagates in an opposite direction to the communications signal. The pump wavelength is coupled to communication signals at the asymmetric Mach-Zehnder interferometer 590 located between the communications-signal demultiplexer 570 and the amplifier 580. Pump signals are decoupled after they have passed through the amplifier 580 at the other asymmetric Mach-Zehnder interferometer 595. The planar waveguide amplifier 580 has an aluminium oxide core (doped with erbium and ytterbium) formed beneath a germanium-doped silica core and is patterned to follow a curved path roughly parallel to the demultiplexer in order to increase the amplification length. As with any planar waveguide, optical losses tend to increase as the radius of curvature of the amplifier 580 decreases. Thus, in order to keep the losses of the amplifier 580 below an acceptable level, the amplifier should not have any curves with a radius of curvature less than a predetermined radius R. A person skilled in the art will understand that R can be calculated for any waveguide, and will depend on (at least): the acceptable level of loss; the waveguide dimensions; and the refractive index contrast between the core and cladding layers. The relatively large difference in refractive indices of aluminium oxide and silica allows aluminium oxide-based waveguides to be formed with relatively tight bends (small R) compared to silica-based waveguides. In order to minimise optical reflections where the terminal ends of the amplifier couple to the silica-based waveguides, the amplifier 580 includes a first adiabatic coupling region 600 for coupling a terminal end of the amplifier with the pump-signal coupling circuit 590 and a second adiabatic coupling region 610 for coupling another terminal end of the amplifier with the pump-signal demultiplexer 595. An embodiment of the first coupling region 600 is shown in FIG. 14 (without the cladding layer for simplicity) and comprises an aluminium-oxide-based core 620 formed directly beneath a silica-based core 630. Although not shown in FIG. 14, the silica-based core 630 is in direct contact with the entire length of the amplifier. In order to adiabatically couple optical signals from the silica-based core 630 to the aluminium-oxide-based core 620, the width of the aluminium-oxide-based core (measured in the plane of the substrate transverse to the core) is tapered adiabatically towards a marginal line 640. The tapering of the cross-sectional dimensions of the aluminium oxide-based core 620 produces a transition of effective refractive index in both cores 620, 630. The second coupling region 610 in FIG. 12 is tapered in the opposite direction to that shown in FIG. 14, but is otherwise identical the first coupling region 600. In a further embodiment of the amplifier (not shown) the amplifier is formed directly on top of a silica-based core but is otherwise identical to the amplifier 580 illustrated in FIGS. 12–14. This embodiment has the disadvantage that it is necessary to expose the underlying silica-based core to each of the processing steps required to form the aluminium oxide based core. However, this can be offset by forming other silica-based cores, such as the cores of the demultiplexer 570 and coupling circuit 590, in a separate step after the amplifier is completed. The silica-based cores of the coupling circuit and demultiplexer can then be butt-coupled to We silica-based core beneath the amplifier. Other means of coupling the amplifier to other waveguides are disclosed in co-pending U.S. patent applications Ser. No. 09/900630 and U.S. Ser. No. 09/900438 both entitled "A Photonic Signal Transmitting Device" and filed on the same day as the present application, in the name of Michael Bazylenko et al. (assigned to Redfern Integrated Optics Pty. Ltd). The disclosures of these two co-pending applications are hereby specifically incorporated by cross-reference.

Figure 13:
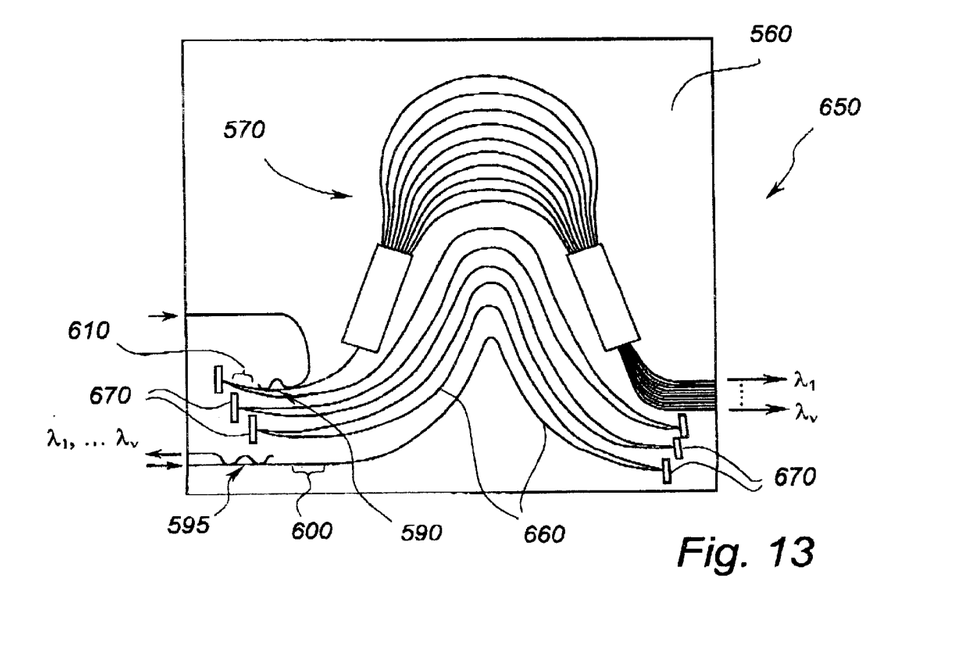
FIG. 13 is a plan view illustrating the planar waveguide layout in a further embodiment of an integrated optical device comprising a demultiplexer, an amplifier which incorporates six mirrors, and a pump-signal coupling circuit.
Figure 15:
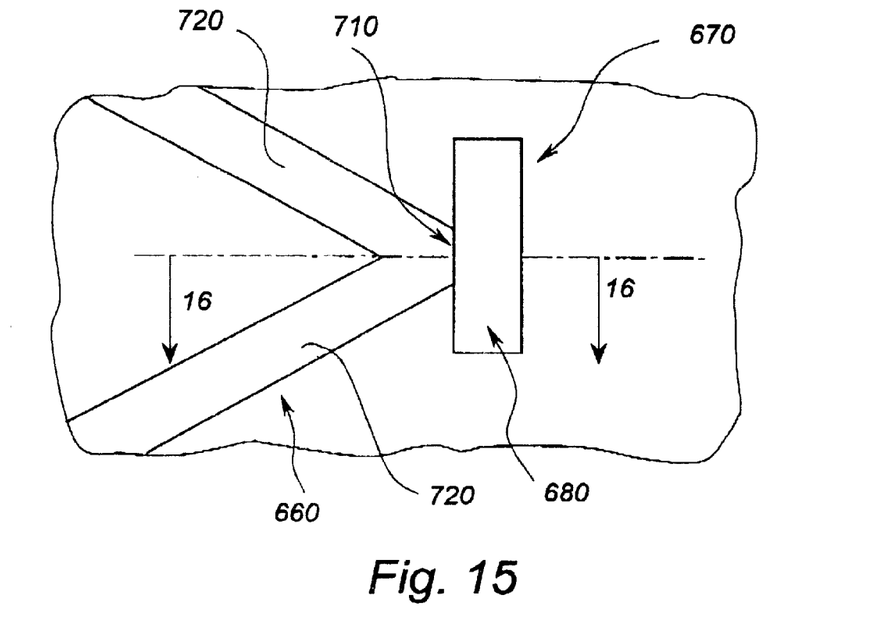
FIG. 15 is a detailed plan view of one of the mirrors and shown in FIG. 13.
Figure 16:
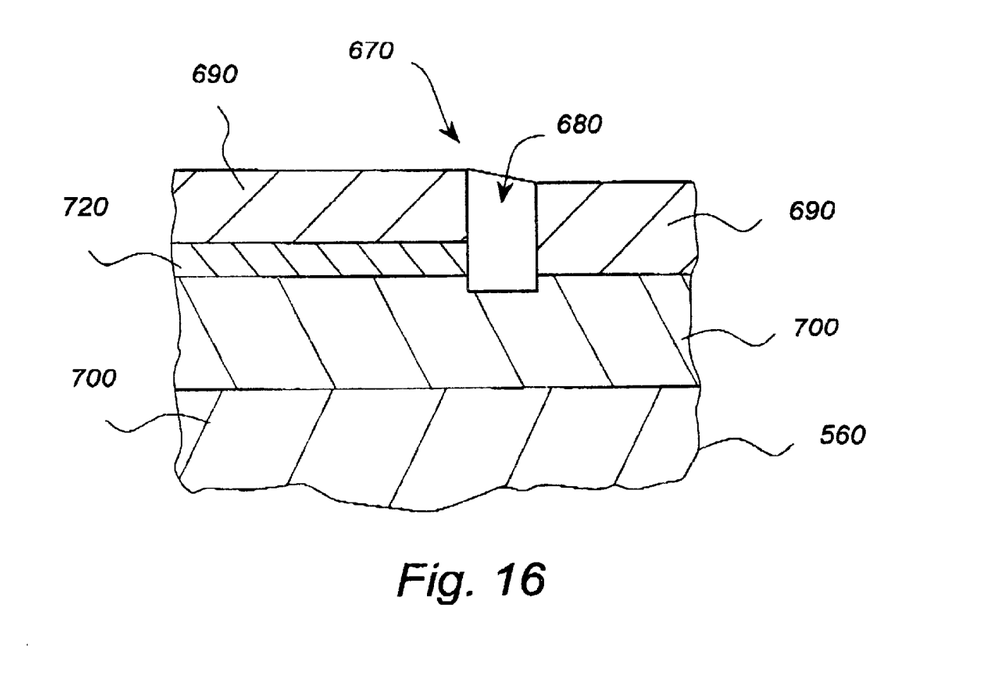
FIG. 16 is a cross-sectional view through a mirror taken along line 16—16 of FIG. 15.

Referring to FIG. 13, there is shown a further embodiment of an integrated optical device 650. Corresponding reference numerals are used where the features are the same as those shown in FIG. 12. The difference between this embodiment and the previous embodiment is in the layout of the amplifier 660. The amplifier 660 in FIG. 13 has a much longer amplification length and therefore higher gain an the amplifier 580 in FIG. 12 since the amplifier 660 includes a plurality of mirrors 670 for reflecting optical signals back and forth in a generally-zigzag pattern. This design can be used to conserve substrate space where the minimum acceptable radius R of waveguide curvature is large. Referring to FIGS. 15 and 16, an embodiment of each of the mirrors 670 shown in FIG. 13 comprises a trench 680 etched through the upper cladding layer 690 and partially into the buffer layer 700 at an end face 710 of the aluminium-oxide-based core 720. Light is reflected by means of total internal reflection at an air interface at the end face 710.

It will be appreciated by a person skilled in the art that numerous variations and/or modifications may be made to the present invention as shown in the specific embodiment without departing from the spirit or scope of the invention as broadly described. The present embodiments are therefore to be considered in all respects illustrative and not restrictive.

I claim:

1. An integrated optical device comprising a metal-oxide-based optical planar waveguide amplifier monolithically integrated on a common substrate with at least one additional planar waveguide selected from a group comprising:
   (i) a planar waveguide signal-processing circuit arranged to process an optical communications signal; and
   (ii) a planar waveguide pump-signal coupling circuit arranged to couple or decouple a pump wavelength to or from the amplifier;
   wherein the amplifier has a core comprising an optically-transmissive metal oxide material doped with a gain medium and is arranged to amplify an optical communication signal when optically pumped with a source of pump radiation.

2. An integrated optical device in accordance with claim 1, wherein the metal oxide in the amplifier core comprises aluminium oxide.

3. An integrated optical device in accordance with claim 1, wherein the amplifier is integrated with and coupled to at least the planar waveguide signal-processing circuit.

4. An integrated optical device in accordance with claim 1, wherein the planar waveguide communications-signal-processing circuit comprises one or a combination of planar waveguide devices selected from a group comprising:
   a communications-signal multiplexer, arranged to multiplex a plurality of communications wavelengths;
   a communications-signal demultiplexer, arranged to demultiplex a plurality of optical communications wavelengths;
   a channel gain equaliser;
   an N×M optical switch matrix;
   an optical modulator;
   an optical attenuator;
   a variable optical attenuator;
   an add-drop multiplexer; and
   a reconfigurable add/drop multiplexer.

5. An integrated optical device in accordance with claim 4, wherein the communications-signal multiplexer and the communications-signal demultiplexer comprise an arrayed-waveguide grating.

6. An integrated optical device in accordance with claim 1, wherein the pump-signal-coupling circuit comprises one or more planar waveguides selected from a group comprising:
   a pump-signal multiplexer arranged to multiplex an optical communications wavelength and an optical pump wavelength; and
   a pump-signal demultiplexer arranged to demultiplex an optical communications wavelength and an optical pump wavelength.

7. An integrated optical device in accordance with claim 6, wherein the pump-signal multiplexer and pump-demultiplexer signal each comprise an asymmetric Mach-Zehnder interferometer.

8. An integrated optical device in accordance with claim, wherein the pump-signal coupling circuit incorporates a slab waveguide for collecting pump radiation from a plurality of sources and guiding the radiation towards the amplifier.

9. An integrated optical device in accordance with claim 1, wherein the pump-signal coupling circuit is arranged to be pumped by a laser diode bar array.

10. An integrated optical device in accordance with claim 1, wherein the source of pump radiation is integrated on the common substrate and optically coupled to the planar waveguide amplifier.

11. An integrated optical device in accordance with claim 1, wherein the source of pump radiation comprises a laser diode bar array.

12. An integrated optical device in accordance with claim 1, wherein the pump radiation is coupled into the amplifier using a cladding mode of the amplifier.

13. An integrated optical device in accordance with claim 1, wherein the amplifier is arranged to provide sufficient gain to compensate for insertion losses of the integrated optical device.

14. An integrated optical device in accordance with claim 1, wherein the amplifier is arranged on the substrate adjacent and substantially parallel to a side of the signal-processing circuit so as to conserve space on the substrate.

15. An integrated optical device in accordance with claim 1, wherein the amplifier includes at least one mirror structure for reflecting and guiding optical signals.

16. An integrated optical device in accordance with claim 15, wherein the mirror structure operates by means of total internal reflection at an air interface.

17. An integrated optical device in accordance with claim 15, wherein the mirror structure comprises an air interface of a trench etched into the surface of the device.

18. An integrated optical device in accordance with claim 15, wherein the mirror structure comprises a metallised surface.

19. An integrated optical device in accordance with claim 15, wherein the mirror structure comprises a Bragg grating.

20. An integrated optical device in accordance with claim 1, wherein the amplifier firer comprises a coupling region for optically coupling a terminal end of the amplifier to another planar waveguide, the coupling region being formed such that there is a gradual transition of effective refractive index from the amplifier to the other waveguide.

21. An integrated optical device in accordance with claim 20, wherein a core of the amplifier is tapered in cross-sectional dimensions and/or refractive index in the coupling region so as to create a substantially adiabatic transition of effective refractive index from the amplifier to the other waveguide.

22. An integrated optical device in accordance with claim 20, wherein the amplifier projects into a second core to which the amplifier is to be coupled.

23. An integrated optical device in accordance with claim 1, wherein the gain medium comprises erbium and/or ytterbium.

24. An integrated optical device in accordance with claim 1, wherein the amplifier core further comprises flourine.

25. An integrated optical device in accordance with claim 1, wherein the signal-processing circuit and pump-signal coupling circuit comprise silica-based waveguides.

26. A method of fabricating an optical device comprising a plurality of planar waveguides monolithically integrated on a common substrate, the method comprising:

forming a planar waveguide amplifier on the substrate, the amplifier having a metaloxide-based core comprising a metal-oxide doped with a gain medium and being arranged to amplify an optical communications signal when optically pumped with a source of pump radiation;

forming at least one additional integrated planar waveguide on the substrate, the additional waveguide being selected from a group comprising:
(i) a planar waveguide communications-signal processing circuit arranged to process an optical communications signal; and
(ii) a planar waveguide pump-signal coupling circuit arranged to couple a pump wavelength into the amplifier.

27. A method in accordance with claim 26, wherein the metal oxide in the core of the amplifier comprises aluminium oxide.

28. A method in accordance with claim 26, wherein the gain medium comprises erbium and/or ytterbium.

29. A method in accordance with claim 26, wherein the core of the amplifier is formed from a metal-oxide-based core layer which is deposited by reactive dc sputtering.

30. A method in accordance with claim 29, wherein the sputtering being carried out in an atmosphere which includes a reactive fluorine-containing gas for incorporating fluorine into the core layer.

31. A method in accordance with claim 29, wherein the dc sputtering includes a step of fluorinating a target used to deposit the core layer, the target fluorination being carried out during the deposition of the core layer and to an extent sufficient to increase a sputtering rate of the target.

32. A method in accordance with claim 26, wherein the metal-oxide based core is formed before the at least one additional integrated planar waveguide is formed.

33. A method in accordance with claim 26, wherein each of the at least one additional integrated planar waveguides is silica-based.

34. A method in accordance with claim 26, wherein the step of forming the amplifier comprises: depositing a core layer; and using lithographically-defamed etching to shape the core layer into a metal-oxide-based core having a channel geometry.

35. A method in accordance with claim 26, wherein the step of forming the amplifier further comprises forming a coupling region at a terminal end of the amplifier for coupling optical signals between the amplifier and another planar waveguide, the coupling region being formed such that there is a gradual transition of effective refractive index from the amplifier to the other waveguide.

36. A method in accordance with claim 35, wherein the gradual transition of effective refractive index is achieved by forming the core such that the terminal end is adiabatically tapered in cross-sectional dimensions and/or refractive index.

37. A method in accordance with claim 26, wherein each planar waveguide in the device includes a silica-based optical cladding layer formed by plasma-enhanced chemical vapour deposition.

38. A method in accordance with claim 37, wherein the plasma-enhanced chemical vapour deposition of each cladding layer is carried out in the absence of nitrogen or nitrogen-containing gases.

39. A method in accordance with claim 37, wherein a liquid source of precursor is used in the plasma-enhanced chemical vapour deposition.

40. A method in accordance with claim 34, wherein the step of forming the amplifier further comprises annealing the core layer below a recrystallization temperature of the metal oxide core layer.

* * * * *